(12) United States Patent
Zaitsu

(10) Patent No.: US 9,601,196 B2
(45) Date of Patent: Mar. 21, 2017

(54) RESISTIVE CHANGE MEMORY INCLUDING CURRENT LIMITATION CIRCUIT

(71) Applicant: KABUSHIKI KAISHA TOSHIBA, Tokyo (JP)

(72) Inventor: Koichiro Zaitsu, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/854,361

(22) Filed: Sep. 15, 2015

(65) Prior Publication Data
US 2016/0078935 A1  Mar. 17, 2016

(30) Foreign Application Priority Data
Sep. 17, 2014 (JP) .................................. 2014-189177

(51) Int. Cl.
G11C 11/00 (2006.01)
G11C 11/36 (2006.01)
G11C 13/00 (2006.01)

(52) U.S. Cl.
CPC ........ *G11C 13/0069* (2013.01); *G11C 13/003* (2013.01); *G11C 13/0023* (2013.01); *G11C 13/0064* (2013.01); *G11C 2013/0071* (2013.01); *G11C 2013/0078* (2013.01); *G11C 2213/74* (2013.01); *G11C 2213/79* (2013.01)

(58) Field of Classification Search
USPC ......................................... 365/148, 163, 175
See application file for complete search history.

(56) References Cited

U.S. PATENT DOCUMENTS

| | | | |
|---|---|---|---|
| 7,978,497 B2 | 7/2011 | Maejima | |
| 8,369,130 B2 | 2/2013 | Maejima | |
| 8,422,269 B2 | 4/2013 | Sasaki et al. | |
| 8,441,837 B2 * | 5/2013 | Ikeda ................. | G11C 13/0007 365/148 |
| 8,477,525 B2 * | 7/2013 | Ito ............................ | G11C 7/14 365/148 |
| 8,498,141 B2 | 7/2013 | Sasaki et al. | |
| 8,659,932 B2 * | 2/2014 | Scheuerlein .......... | B82Y 10/00 365/148 |
| 8,665,632 B2 * | 3/2014 | Toda ................... | G11C 13/0011 365/148 |
| 8,767,437 B2 | 7/2014 | Sasaki | |

(Continued)

FOREIGN PATENT DOCUMENTS

| | | |
|---|---|---|
| JP | 2009-217908 | 9/2009 |
| JP | 2011-108327 | 6/2011 |

(Continued)

*Primary Examiner* — Trong Phan
(74) *Attorney, Agent, or Firm* — Finnegan, Henderson, Farabow, Garrett & Dunner LLP

(57) ABSTRACT

A semiconductor integrated circuit includes: first and second wiring lines; resistive change memories disposed intersection regions of the first and second wiring lines; and a control circuit controlling the first and second drivers to select one of the first wiring lines and one of the second wiring lines, the control circuit changing a resistance of the selected one of the resistive change memories from the first resistive state to the third resistive state, and then changing the resistive state of the selected one of the resistive change memories from the third resistive state to the second resistive state.

19 Claims, 14 Drawing Sheets

(56) References Cited

U.S. PATENT DOCUMENTS

| | | | |
|---|---|---|---|
| 9,136,468 B2 * | 9/2015 | Nakai | ................... H01L 45/06 |
| 2012/0069628 A1 | 3/2012 | Ito | |
| 2015/0263072 A1 | 9/2015 | Zaitsu et al. | |

FOREIGN PATENT DOCUMENTS

| | | |
|---|---|---|
| JP | 2011-175716 | 9/2011 |
| JP | 2012-59321 | 3/2012 |
| JP | 2012-69196 | 4/2012 |
| JP | 2012-203962 | 10/2012 |
| JP | 2014-049230 | 3/2014 |
| JP | 2015-18590 | 3/2015 |
| JP | 2015-173224 | 10/2015 |
| WO | WO 2015/005149 | 1/2015 |

* cited by examiner

RESISTIVE CHANGE MEMORY INCLUDING CURRENT LIMITATION CIRCUIT

CROSS REFERENCE TO RELATED APPLICATIONS

This application is based upon and claims the benefit of priority from prior Japanese Patent Application No. 2014-189177 filed on Sep. 17, 2014 in Japan, the entire contents of which are incorporated herein by reference.

FIELD

Embodiments described herein relate generally to semiconductor integrated circuits.

BACKGROUND

A resistive change memory is a nonvolatile memory including two electrodes and a resistive change layer disposed between the two electrodes. The resistance between the electrodes can be switched between a low-resistance state and a high-resistance state by applying a predetermined voltage between the electrodes. This allows the resistive change memory to be programmed. The resistive state of the programmed resistive change memory is maintained even if the power is turned off.

The magnitude of voltage to be applied between the electrodes and the period of time during which the voltage is applied should be controlled appropriately in programming a resistive change memory. Controlling the magnitude of current flowing through the resistive change memory while a program voltage is being applied is also important. Semiconductor integrated circuits including a circuit for controlling the current flowing through a resistive change memory during the programming, as described above, are well known.

If a plurality of resistive change memories of a semiconductor integrated circuit each having a different resistance are programmed to a high-resistance state under identical program conditions, the resistive states of the respective resistive change memories after being programmed may often differ. For example, if a resistive change memory with a relatively high resistance and a resistive change memory with a relatively low resistance are programmed to a high-resistance state under the same program conditions, sometimes the latter resistive change memory becomes to have a greater resistance than the former after the programming.

Therefore, in order to control the resistance of a resistive change memory after being programmed, appropriate program conditions should be selected in accordance with the resistance of the resistive change memory before being programmed. However, such program conditions are unknown at the present stage.

BRIEF SUMMARY OF THE INVENTION

A semiconductor integrated circuit according to an embodiment of the invention includes: a plurality of first wiring lines; a plurality of second wiring lines crossing the first wiring lines; a plurality of resistive change memories disposed at intersection regions of the first wiring lines and the second wiring lines, the resistive change memories each including a first electrode connected to a corresponding one of the first wiring lines, a second electrode connected to a corresponding one of the second wiring lines, and a resistive change layer disposed between the first electrode and the second electrode, a resistance between the first electrode and the second electrode being changeable among a first resistive state, a second resistive state, and a third resistive state, the second resistive state having a resistance greater than a resistance of the first resistive state, the third resistive state having a resistance lower than the resistance of the first resistive state, the resistive change memories having a first memory state in which the resistance between the first electrode and the second electrode is in the first resistive state, and a second memory state that the resistance between the first electrode and the second electrode is in the second resistive state; a first driver configured to drive the first wiring lines; a second driver configured to drive the second wiring lines; and a control circuit configured to control the first driver and the second driver, the control circuit controlling the first driver and the second driver to select one of the first wiring lines and one of the second wiring lines for selecting one of the resistive change memories, and to program the selected one of the resistive change memories from the first memory state to the second memory state through the third resistive state.

DETAILED DESCRIPTION

A semiconductor integrated circuit according to an embodiment includes: a plurality of first wiring lines; a plurality of second wiring lines crossing the first wiring lines; a plurality of resistive change memories disposed at intersection regions of the first wiring lines and the second wiring lines, the resistive change memories each including a first electrode connected to a corresponding one of the first wiring lines, a second electrode connected to a corresponding one of the second wiring lines, and a resistive change layer disposed between the first electrode and the second electrode, a resistance between the first electrode and the second electrode being changeable among a first resistive state, a second resistive state, and a third resistive state, the second resistive state having a resistance greater than a resistance of the first resistive state, the third resistive state having a resistance lower than the resistance of the first resistive state, the resistive change memories having a first memory state in which the resistance between the first electrode and the second electrode is in the first resistive state, and a second memory state that the resistance between the first electrode and the second electrode is in the second resistive state; a first driver configured to drive the first wiring lines; a second driver configured to drive the second wiring lines; and a control circuit configured to control the first driver and the second driver, the control circuit controlling the first driver and the second driver to select one of the first wiring lines and one of the second wiring lines for selecting one of the resistive change memories, and to program the selected one of the resistive change memories from the first memory state to the second memory state through the third resistive state.

Embodiments will now be explained with reference to the accompanying drawings.

First Embodiment

Figure 1:
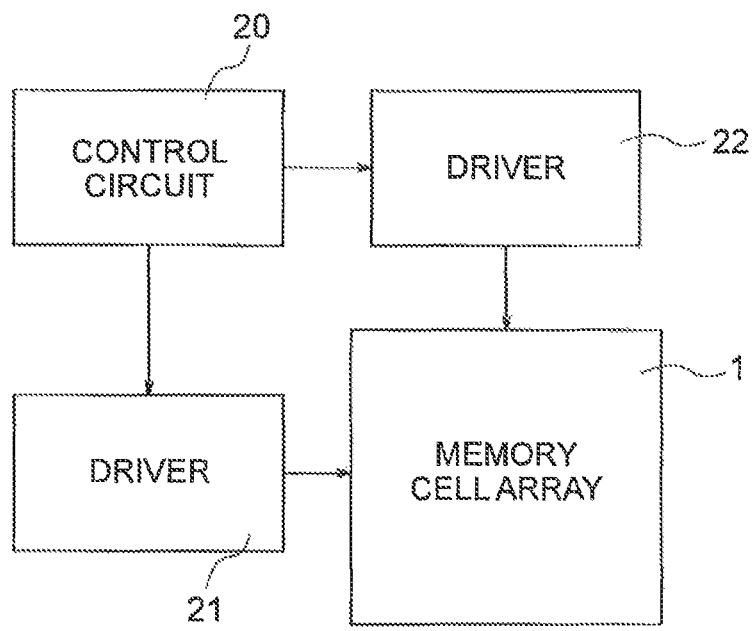
FIG. 1 is a block diagram showing a semiconductor integrated circuit according to a first embodiment.

FIG. 1 shows a semiconductor integrated circuit according to a first embodiment. The semiconductor integrated circuit according to the first embodiment includes a memory cell array 1, a control circuit 20, a driver 21, and a driver 22. The memory cell array 1 includes a plurality of memory cells arranged in a matrix form, and is driven by the driver 21 and the driver 22. The drivers 21, 22 each receive control signals from the control circuit 20, and apply a program voltage to a selected memory cell based on the control signals. The drivers 21, 22 may apply a predetermined voltage to unselected memories based on the aforementioned control signals, or may cause the potential of the electrodes of a specific memory to be in a floating state.

Figure 2:
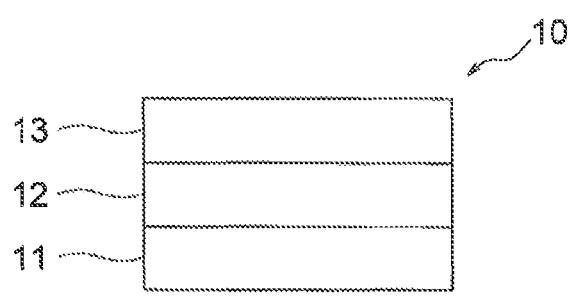
FIG. 2 is a cross-sectional view of a resistive change memory according to the first embodiment.

Each memory cell includes a resistive change memory (hereinafter also referred to "memory") 10 shown in FIG. 2. The memory 10 includes electrodes 11, 13 and a resistive change layer 12 sandwiched between the electrodes 11, 13. The resistive change layer 12 may be formed of a metal oxide such as titanium oxide, hafnium oxide, tantalum oxide, and aluminum oxide, or a metal oxynitride such as titanium oxynitride, hafnium oxynitride, tantalum oxynitride, and aluminum oxynitride. Furthermore, a semiconductor oxide like silicon oxide, a semiconductor nitride like silicon nitride, or a semiconductor oxynitride like silicon oxynitride may also be used. A semiconductor material like amorphous silicon or a film including layers of the aforementioned materials may also be used to form the resistive change layer 12.

The electric resistance between the electrodes in the memory 10 may be switched by applying a predetermined voltage between the electrodes 11, 13. The term "set" herein means that the resistive state of the memory 10 is switched from a high-resistance state to a low-resistance state, and the term "reset" herein means that the resistive state is switched from a low-resistance state to a high-resistance state. A voltage needed for setting the memory 10 is herein called "set voltage," and a voltage needed for resetting the memory 10 is herein called "reset voltage."

The memory 10 may be either a unipolar memory or bipolar memory. In a unipolar memory, the polarity of the set voltage is the same as that of the reset voltage. If, for example, a voltage higher than a voltage applied to the electrode 11 is applied to the electrode 13 in order to set the memory 10, a voltage higher than a voltage applied to the electrode 11 is applied to the electrode 13 in order to reset the memory 10. On the other hand, the polarity of the set voltage is opposite to that of the reset voltage in a bipolar memory. If, for example, a voltage higher than a voltage applied to the electrode 11 is applied to the electrode 13 in order to set the memory 10, a voltage lower than a voltage applied to the electrode 11 is applied to the electrode 13 in order to reset the memory 10.

Whether a memory is a unipolar memory or a bipolar memory is determined by the materials of the electrodes and the resistive change layer, or the voltage conditions for the forming (activation of memory functions after manufacture by applying a predetermined voltage between the electrodes of a memory). Similarly, the polarity of the set voltage or reset voltage is determined by the materials of the electrodes and the resistive change layer, or the voltage conditions for the forming.

When a set voltage or reset voltage is applied to the memory 10, the current flowing through the memory 10 should be equal to or less than a predetermined value (limited current value) to suppress variations in resistance of the programmed memory 10 or to prevent irreversible breakdown of the memory 10. This will be described in more detail below, taking an example of a case where a set voltage is applied.

When a set voltage is applied to the memory 10 in a high-resistance state, the current initially flowing through the memory 10 is low since the resistance of the memory 10 is large in the initial state. However, the resistance of the memory 10 gradually decreases, and thus the current flowing through the memory 10 gradually increases. Once a large current flows through the memory 10, the current further accelerates the change in the state of the memory 10, and the memory 10 rapidly changes into the low-resistance state. This change in resistance occurs in a very short period of time, and thus is difficult to stop. Therefore, it is highly possible that the resistance of the memory 10 may eventually become too low and the memory 10 may be changed into an irreversible breakdown state. In order to prevent the breakdown state and to control the resistance after the setting operation to be a predetermined value, the change in resistance of the memory 10 should be stopped at an appropriate time. However, since the change in resistance occurs in a very short period of time, it is difficult to stop it by, for example, controlling the time during which the set voltage is applied.

Therefore, a method may be employed in which a current-limiting element such as a resistor or a transistor is connected in series with the memory 10, and the set voltage is applied to the memory 10 via the current-limiting element. For example, a memory 10 in a high-resistance state is connected in series with a current-limiting element having a resistance that is lower than the resistance of the memory 10, and a set voltage is applied to the memory 10 via the current-limiting element. In the initial stage, the current flowing through the memory 10 is low since the resistance of the memory 10 is large, and most of the set voltage is applied to the memory 10 since the resistance of the current-limiting element is lower than that of the memory 10. As the resistance of the memory 10 decreases, the current flowing through the memory 10 increases. When the resistance of the memory 10 becomes in the same level as the resistance of the current-limiting element, a certain degree of the set voltage is applied to the current-limiting element, and thus the voltage applied to the memory 10 decreases. When the voltage applied to the memory 10 decreases to a certain level, the change in resistance of the memory 10 stops.

In the aforementioned method, the change in resistance of the memory 10 stops since the voltage applied to the memory 10 automatically decreases as the resistance of the memory 10 becomes close to the resistance of the current-limiting element. Therefore, the resistance of the memory 10 after the set operation may be controlled to be at a predetermined value by controlling the resistance of the current-limiting element. The irreversible breakdown of the memory 10 may be prevented if the resistance of the current-limiting element is set to be sufficiently high.

Setting the resistance of the current-limiting element to be sufficiently high is equivalent to setting the limited current value to be low, and on the contrary, setting the resistance of the current-limiting element to be low is equivalent to setting the limited current value to be high.

Generally, if the limited current value in setting the memory 10 increases, the resistance of the memory 10 after the setting decreases. In resetting the memory 10, the limited current value should be sufficiently large to cause a sufficient amount of current through the memory 10 in order to generate heat that changes the resistive state of the memory 10 to a high-resistance state. As described above, different limited current values are used in setting and resetting the memory 10. In other words, the set voltage in a setting operation and the reset voltage in a resetting operation are applied via different current-limiting elements having different resistances.

Example of Current Limitation Circuit

Figure 3A:
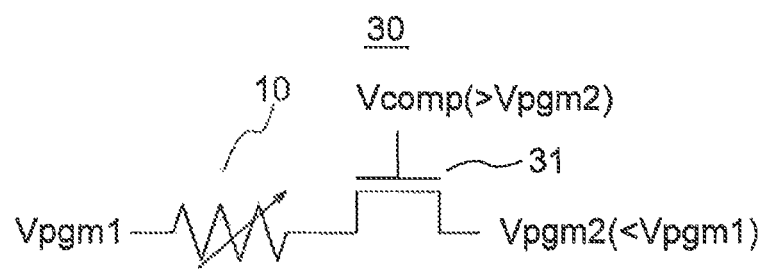
FIGS. 3A and 3B are diagrams showing examples of a current limitation circuit.
Figure 3B:
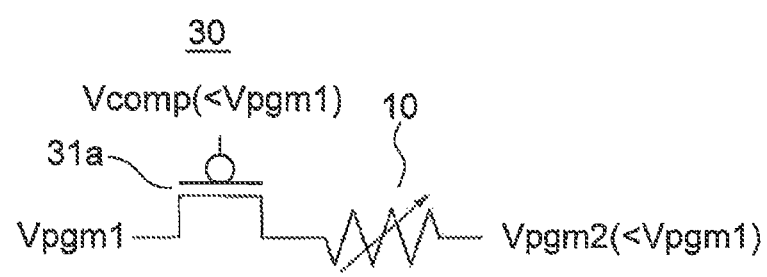

FIGS. 3A and 3B show examples of a current limitation circuit for generating a limited current value. The current limitation circuit 30 includes a transistor connected in series with the memory 10. The maximum current flowing through the memory 10 is controlled by controlling a voltage Vcomp applied to the gate of the transistor. This transistor corresponds to the current-limiting element. The resistance of the current-limiting element is controlled by controlling the voltage Vcomp. In the example shown in FIG. 3A, an n-channel transistor 31 is used, a voltage Vpgm1 is applied to one of the electrodes of the memory 10, and a voltage Vpgm2 that is lower than the voltage Vpgm1 is applied to the other electrode via the n-channel transistor 31. A voltage Vcomp that is higher than the voltage Vpgm2 is applied to the gate of the transistor 31 at this time. The maximum current flowing through the memory 10 during the programming is controlled by controlling the magnitude of the voltage Vcomp.

FIG. 3B shows an example in which a p-channel transistor 31a is used as the current limitation circuit 30. In this example, a voltage Vpgm2 is applied to one of the electrodes of the memory 10, and a voltage Vpgm1 that is higher than the voltage Vpgm2 is applied to the other electrode via the p-channel transistor 31a. A voltage Vcomp that is lower than the voltage Vpgm1 is applied to the gate of the transistor 31a at this time. The maximum current flowing through the memory 10 during the programming is controlled by controlling the magnitude of the voltage Vcomp.

As described above, a plurality of limited current values can be set in the examples shown in FIGS. 3A and 3B by changing the value of the voltage Vcomp applied to the gate of the transistor.

Other Examples of Current Limitation Circuit

Figure 4A:
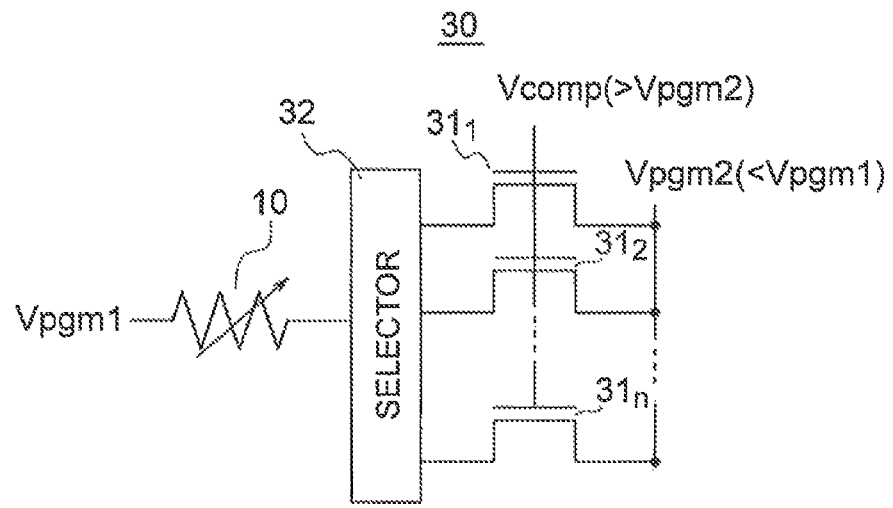
FIGS. 4A and 4B are diagrams showing other examples of the current limitation circuit.
Figure 4B:
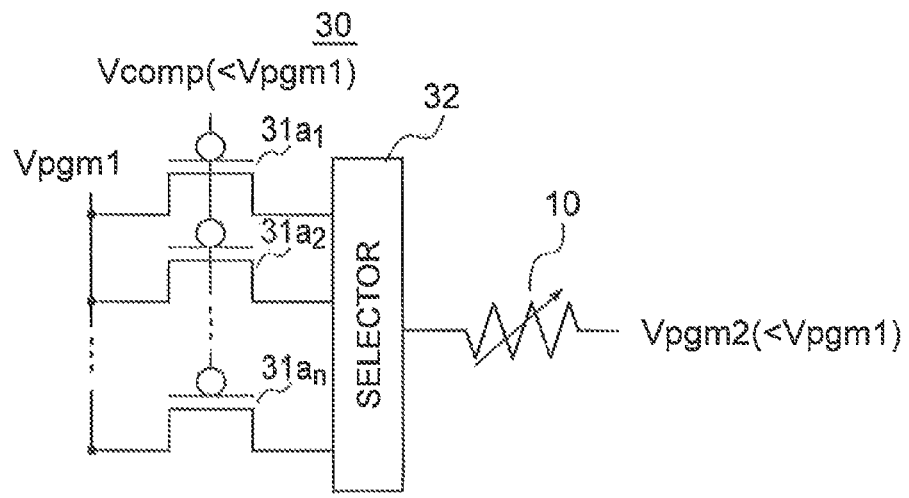

FIGS. 4A and 4B show other examples in which the current limitation circuit 30 includes a plurality of transistors and a selector. In the example shown in FIG. 4A, the current limitation circuit 30 includes n (n≥2) n-channel transistors $31_1$-$31_n$ and a selector 32. In this case, a voltage Vpgm1 is applied to one of the electrodes of the memory 10, and the selector 32 is connected to the other electrode of the memory 10. The sources or the drains of the respective transistors $31_1$-$31_n$ are connected to the selector 32 to allow the selector 32 to select one of the transistors $31_1$-$31_n$. A voltage Vpgm2 that is lower than the voltage Vpgm1 is applied to the other of the source and the drain of each transistor $31_i$ (i=1, ..., n). A voltage Vcomp that is higher than the voltage Vpgm2 is applied to the gate of each transistor $31_i$ (i=1, ..., n).

In the example shown in FIG. 4B, the current limitation circuit 30 includes n (n≥2) p-channel transistors $31a_1$-$31a_n$ and a selector 32. In this case, a voltage Vpgm2 is applied to one of the electrodes of the memory 10, and the selector 32 is connected to the other electrode of the memory 10. The sources or the drains of the respective transistors $31a_1$-$31a_n$ are connected to the selector 32, allowing the selector 32 to select one of the transistors $31a_1$-$31a_n$. A voltage Vpgm1 that is higher than the voltage Vpgm2 is applied to the other of the source and the drain of each transistor $31a_i$ (i=1, ..., n). A voltage Vcomp that is lower than the voltage Vpgm1 is applied to the gate of each transistor $31_i$ (i=1, ..., n).

The examples shown in FIGS. 4A and 4B are designed in such a manner that the driving capability of each transistor may be different, and the amount of current flowing between the source and the drain of each transistor differs in each transistor. Specifically, the transistors are formed so that at least one of the channel widths, the gate length, the thickness of the gate insulating film, and the channel impurity concentration is different from each other. In programming the memory 10, the selector connects the memory 10 and a specific one of the transistors in accordance with the degree of current limitation.

Each of the current limitation circuits shown in FIGS. 3A to 4B is disposed in at least one of the driver 21 and the driver 22 shown in FIG. 1.

The limited current value is generally set to be low if the memory 10 is set, controlling the maximum value of the current flowing through the memory 10 to be low. The resistance of the memory 10 after a set operation is dependent on the limited current value, and as the limited current value decreases, the resistance of the memory 10 increases. If the memory 10 is to be reset, the limited current value is increased to cause a sufficient amount of current to flow through the memory 10 to generate heat needed for resetting the memory 10.

Figures 5A, 5B:
FIG. 5A is a diagram showing a result of measuring the resistances of a plurality of memories before and the after the resetting.
FIG. 5B is a diagram showing the relationship between the resistance before the resetting and the reset voltage of the memory 10.

When two or more memories 10 each in a low-resistance state are reset using identical program conditions, the resistances of the respective memories 10 after being reset may differ from each other. Specifically, a memory 10 with a lower resistance may get to have a higher resistance after the resetting if memories 10 are formed of a combination of suitable materials. This will be described with reference to FIGS. 5A and 5B. FIG. 5A shows a result of measuring the resistances before and after resetting a plurality of memories. The lateral axis indicates the resistance (ON resistance) of the memories 10 before the resetting, and the longitudinal axis indicates the resistance (OFF resistance) of the memories 10 after the resetting.

On the other hand, it is understood from the comparison of reset voltages among a plurality of memories that a memory 10 with a lower resistance is reset at a lower reset voltage, i.e., the resetting occurs with a lower voltage. FIG. 5B shows the relationship between the resistance before the resetting and the reset voltage of the memory 10. The lateral axis indicates the resistance of the memory 10 before the resetting, and the longitudinal axis indicates the reset voltage.

If the reset voltage is too low, the probability of the memory 10 being reset unintentionally becomes higher. For example, a subtle voltage applied to the memory 10 in a read operation or an operation for programming another memory may change the state of the memory 10. The probability may be reduced if the reset voltage becomes sufficiently higher.

As can be understood from FIG. 5B, the unintentional resetting of the memory 10 may be prevented by setting the ON resistance thereof to a relatively high value. However, as can be understood from FIG. 5A, if the ON resistance of the memory 10 is high, the OFF resistance after the resetting cannot be set to be sufficiently high. If the OFF resistance is not high sufficiently, a large leakage current is generated by the memory 10 in a high-resistance state, which leads to misreading and increased power consumption.

Program Method

In order to have a sufficiently high reset voltage and a sufficiently high OFF resistance, which is the resistance after the resetting, of the memory 10, the following program method is employed in the first embodiment. When the memory 10 is to be set, the limited current value is set at a first current value Icomp1, and the set voltage is applied to the memory 10. When the memory 10 is to be reset, the limited current value is set at a second current value Icomp2 that is higher than the first current value Icomp1, then the set voltage is applied to the memory 10. Thereafter, the limited current value is set at a third current value Icomp3 that is higher than the second current value Icomp2, and then the reset voltage is applied to the memory 10.

This may also be described in the following manner. When the memory 10 is set, a current-limiting element having a first resistance Rcomp1 is connected in series with the memory 10, and then the set voltage is applied thereto. When the memory 10 is reset, a current-limiting element having a second resistance Rcomp2 that is lower than the first resistance Rcomp1 is connected in series with the memory 10 and the set voltage is applied thereto, and thereafter a current-limiting element having a third resistance Rcomp3 that is lower than the second resistance Rcomp2 is connected in series with the memory 10, and the reset voltage is applied thereto.

Figure 6:
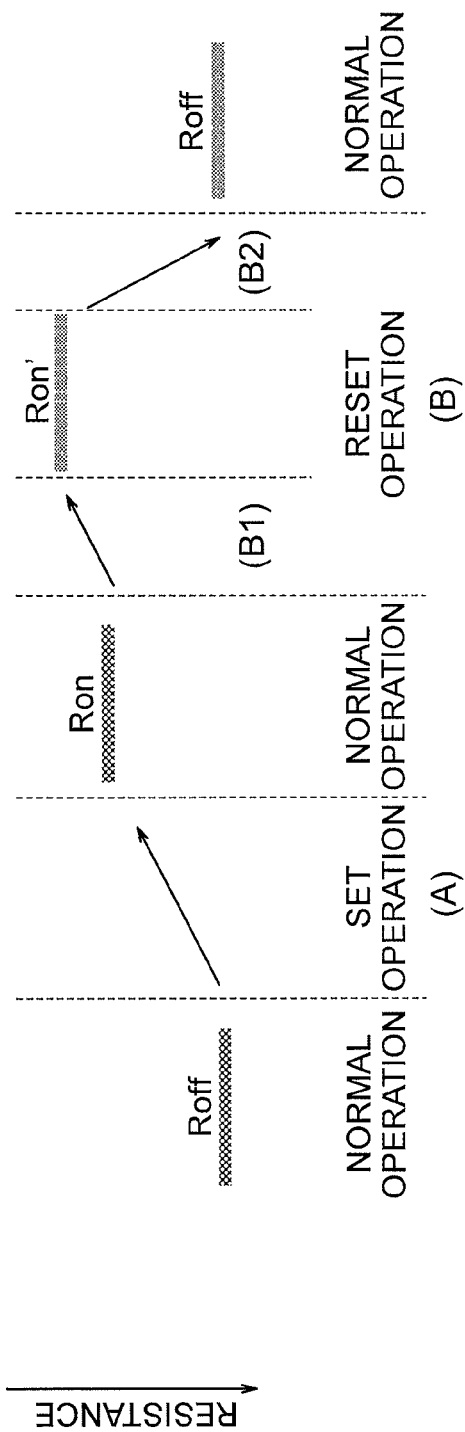
FIG. 6 is an explanatory diagram illustrating a program method for the first embodiment.

FIG. 6 briefly shows the program method according to the first embodiment. A set operation (A) is performed to make the resistance of the memory 10 be a preferred ON resistance Ron. This ON resistance Ron is set to be relatively high to prevent the unintentional resetting of the memory 10.

In a reset operation (B), first a set operation (B1) is performed to change the resistance to a lower ON resistance Ron', and then a reset operation (B2) is performed. This leads to a sufficiently high OFF resistance Roff after the reset operation.

If the first current value Icomp1 is set at a relatively low value, i.e., if the first resistance Rcomp1 is set at a relatively high value, in this program method, the ON resistance of the memory 10 can be prevented from becoming too low. This may reduce the probability of unintentional resetting of the memory 10. Since the reset operation is preceded by the set operation with the relatively high second current value Icomp2 (by setting the second resistance Rcomp2 at a relatively low value), the ON resistance of the memory 10 may be temporarily reduced satisfactorily. The reset voltage applied thereafter may lead to a sufficiently high OFF resistance. The third limited current value Icomp3 used when the reset voltage is applied is set at a sufficiently high value (by setting the third resistance Rcomp3 at a satisfactorily low value) in order to cause a sufficiently large current to flow through the memory 10.

Figure 15:
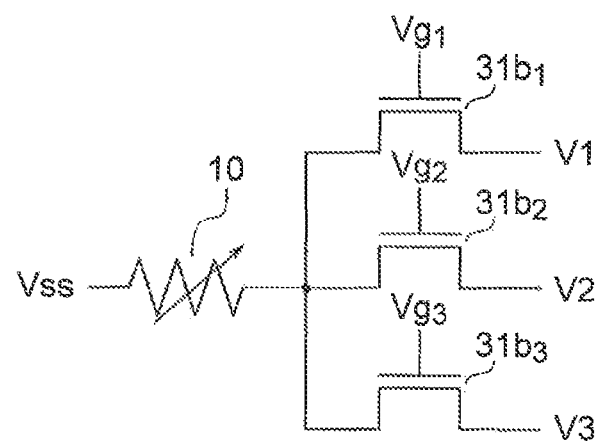
FIG. 15 is a diagram showing an example of a circuit for executing the program shown in FIG. 6.
Figure 16:
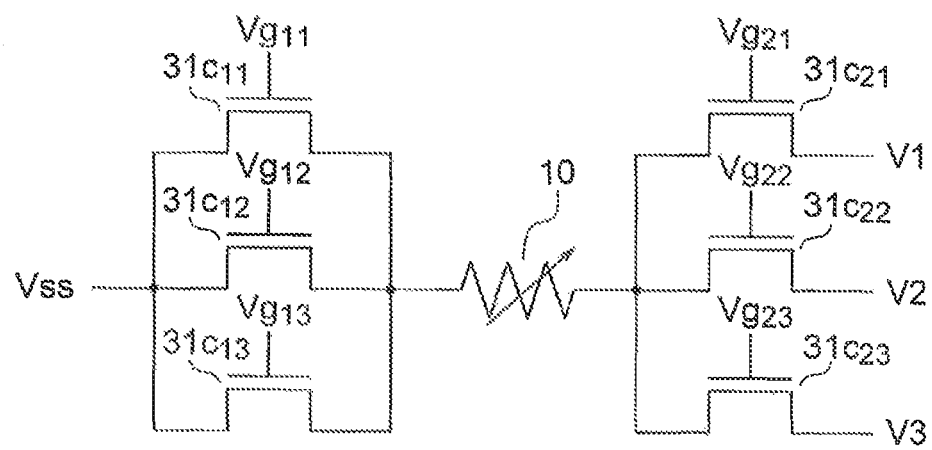
FIG. 16 is a diagram showing another example of a circuit for executing the program shown in FIG. 6.

FIGS. 15 and 16 show examples of a circuit for executing the program illustrated in FIG. 6. In a first example circuit shown in FIG. 15, when the memory 10 is set, a set voltage V1 is applied to one of the electrodes of the memory 10 via a transistor $31b_1$. At this time, a gate voltage Vg1 is controlled so that the channel resistance of the transistor $31b_1$ is at Rcomp1. On the other hand, when the memory 10 is reset, first a set voltage V2 is applied to the one of the electrodes of the memory 10 via a transistor $31b_2$, and thereafter a reset voltage V3 is applied to the one of the electrodes of the memory 10 via a transistor $31b_3$. At this time, a gate voltage Vg2 is controlled so that the channel resistance of the transistor $31b_2$ is at Rcomp2, and a gate voltage Vg3 is controlled so that the channel resistance of the transistor $31b_3$ is at Rcomp3. Rcomp2 is lower than Rcomp1, and Rcomp3 is lower than Rcomp2. A ground voltage Vss is applied to the other of the electrodes of the memory 10.

In a second example circuit shown in FIG. 16, when the memory 10 is set, the ground voltage Vss is applied to one of the electrodes of the memory 10 via a transistor $31c_{11}$, and a set voltage V1 is applied to the other of the electrodes of the memory 10 via a transistor $31c_{21}$. At this time, gate voltages Vg11, Vg21 are controlled so that the sum of the channel resistances of the transistors $31c_{11}$, $31c_{21}$ is at Rcomp1. On the other hand, when the memory 10 is reset, first the ground voltage Vss and the set voltage V2 are applied to the memory 10 via the transistor $31c_{12}$ and the transistor $31c_{22}$, respectively, and thereafter, the ground voltage Vss and a reset voltage V3 are applied to the memory 10 via a transistor $31c_{13}$ and a transistor $31c_{23}$, respectively. At this time, gate voltages Vg12, Vg22 are controlled so that the sum of the channel resistances of the transistors $31c_{12}$, $31c_{22}$ is at Rcomp2, and gate voltages Vg13, Vg23 are controlled so that the sum of the channel resistances of the transistors $31c_{13}$, $31c_{23}$ is at Rcomp3, Rcomp2 is lower than Rcomp1, and Rcomp3 is lower than Rcomp2.

Although n-type transistors are used in the example circuits shown in FIGS. 15 and 16, part or all of the transistors may be replaced with p-type transistors.

Set Operation

Figure 7:
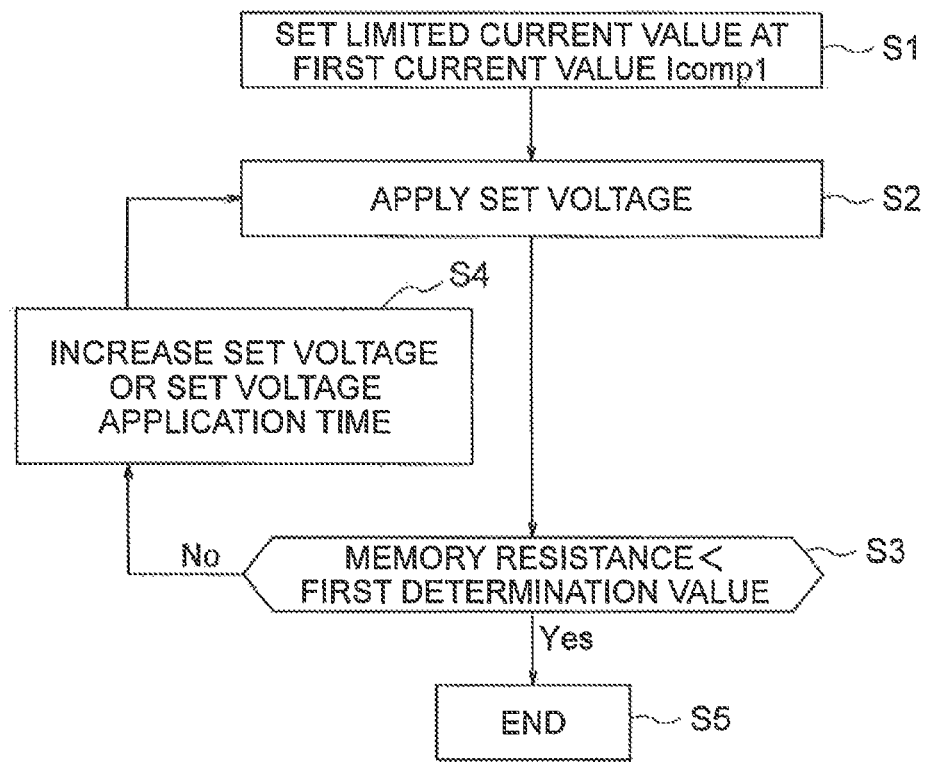
FIG. 7 is a flow chart showing an example of a specific process of set operation.

FIG. 7 is a flow chart showing an example of a specific process of the set operation. First, the limited current value is set at a first current value Icomp1 (S1), i.e., a current-limiting element having a first resistance Rcomp1 is connected in series with the memory 10, and a set voltage is applied to the memory 10 (S2). Subsequently, the resistance of the memory 10 is read, and the read value is compared with a first determination value (S3). If the resistance of the memory 10 is less than the first determination value, the set operation is ended (S5). If the resistance of the memory 10 is greater than the first determination value, the set voltage is applied again. At this time, a voltage higher than the previously applied voltage may be used as the set voltage, or the voltage is applied for a longer period of time than the previous time (S4). This applies a greater stress to the memory 10. Subsequently, the resistance of the memory 10 is read again, and the read value is compared with the first determination value (S3). The foregoing procedure is repeated until the resistance of the memory 10 becomes lower than the first determination value.

Figure 8:
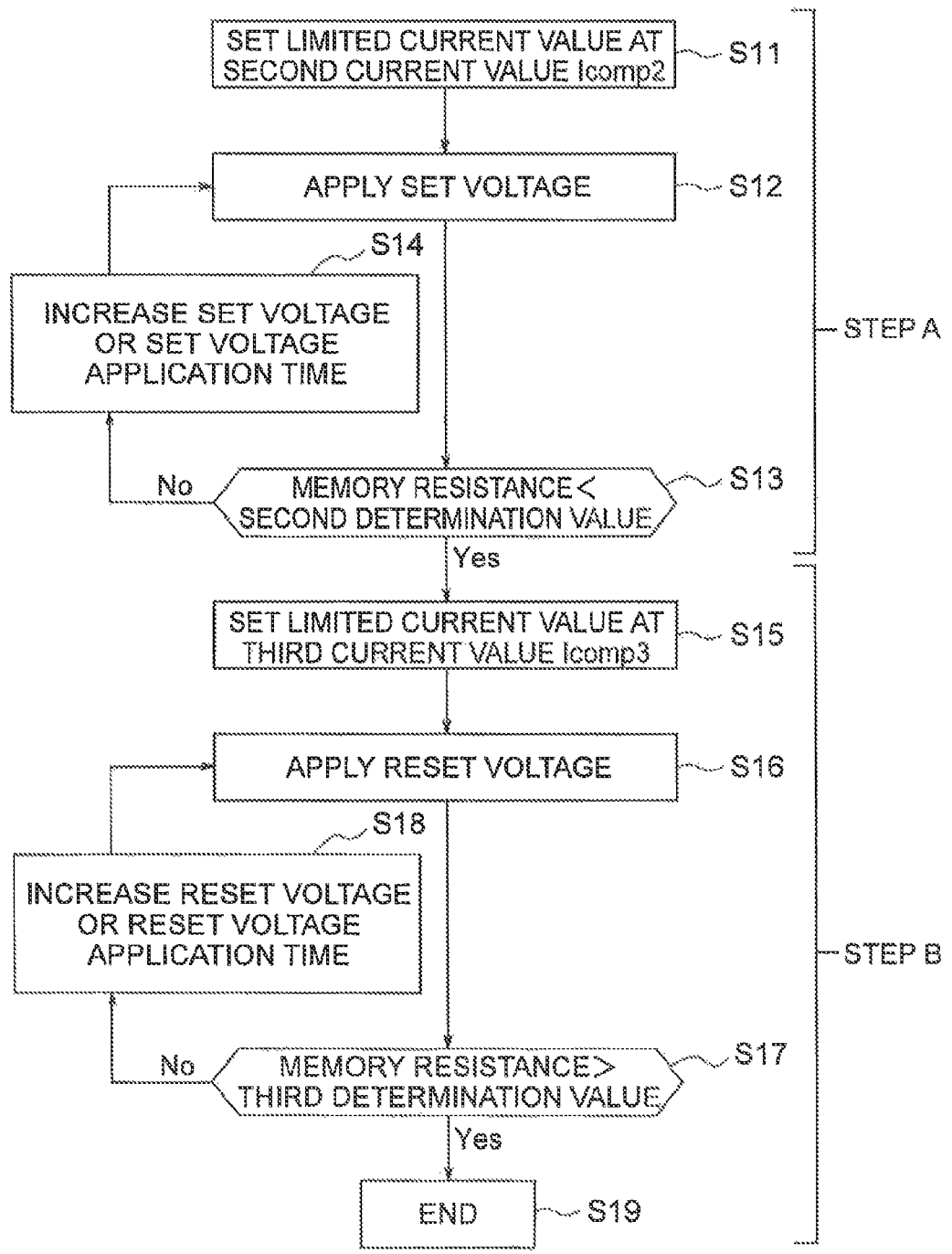
FIG. 8 a flow chart showing an example of a specific process of reset operation.

FIG. 8 is a flow chart showing an example of a specific process of a reset operation. This process is divided into steps A and B. In step A, the limited current value is set at a second current value Icomp2 (S11), i.e., a current-limiting element having a second resistance Rcomp2 is connected in series with the memory 10, and a set voltage is applied to the memory 10 (S12). Subsequently, the resistance of the memory 10 is read, and the read value is compared with a second determination value (S13). If the resistance of the memory 10 is lower than the second determination value, the process goes to step B. If the resistance of the memory 10 is higher than the second determination value, the set voltage is applied again. At this time, a voltage higher than the previously applied voltage may be used as the set voltage, or the voltage is applied for a longer period of time than the previous time (S14). This applies a greater stress to the memory 10. Subsequently, the resistance of the memory 10 is read again, and the read value is compared with the second determination value (S13). This procedure is repeated until the resistance of the memory 10 becomes lower than the second determination value. The second current value Icomp2 is set to be higher than the first current value Icomp1, i.e., the second resistance Rcomp2 is set to be lower than the first resistance Rcomp1, and the second determination value is set to be lower than the first determination value.

In step B, the limited current value is set at a third current value Icomp3 (S15), i.e., a current-limiting element having a third resistance Rcomp3 is connected in series with the memory 10, and a reset voltage is applied to the memory 10 (S16). Subsequently, the resistance of the memory 10 is read, and the read value is compared with the third determination value (S17). If the resistance of the memory 10 is greater than the third determination value, the reset operation is ended (S19). If the resistance of the memory 10 is less than the third determination value, the reset voltage is applied again. At this time, a voltage higher than the previously used voltage may be used as the reset voltage, or the voltage is applied for a longer period of time than the previous time (S18). This applies a greater stress to the memory 10. Subsequently, the resistance of the memory 10 is read again, and the read value is compared with the third determination value (S17). This procedure is repeated until the resistance of the memory 10 becomes higher than the third determination value. The step S13 in which the resistance of the memory 10 is compared with the second determination value may be omitted. In this case, the process may proceed to step S15 immediately after the limited current value may be set as the second current value Icomp2, i.e., the current-limiting element having the second resistance Rcomp2 is connected in series with the memory 10, and the set voltage is applied. The third current value Icomp3 is set to be greater than the second current value Icomp2 (by setting the third resistance Rcomp3 to be lower than the second resistance Rcomp2), and the third determination value is set to be greater than the first determination value.

The OFF resistance of the memory 10 can be satisfactorily increased by using the reset operation shown in FIG. 8.

Another Example of Set Operation

Another example of a specific process of the set operation will be described next with reference to FIG. 9. First, the limited current value is set at Icomp1 as in the case shown in FIG. 7 (S1), i.e., the current-limiting element having the first resistance Rcomp1 is connected in series with the memory 10, and the set voltage is applied to the memory 10 (S2). Then, the resistance of the memory 10 is read, and the read value is compared with a first determination value (S3). If the resistance of the memory 10 is lower than the first determination value, the process proceeds to the next step S5. If the resistance of the memory 10 is more than the first determination value, the set voltage is applied to the memory 10 again. At this time, a voltage higher than the previously applied voltage may be used as the set voltage, or the voltage is applied for a longer period of time than the previous time (S4). This applies a greater stress to the memory 10. Subsequently, the resistance of the memory 10 is read again, and the read value is compared with the first determination value. This procedure is repeated until the resistance of the memory 10 becomes lower than the first determination value. If the resistance of the memory 10 becomes lower than the first determination value, the resistance of the memory 10 is compared with a fourth determination value (S5). If the resistance of the memory 10 is higher than the fourth determination value, the set operation is ended. If the resistance of the memory 10 is lower than the fourth determination value, the memory 10 is once reset, and the process is performed again from the first step. The procedure is the same as that in step B shown in FIG. 8. First, the limited current value is set at the third current value Icomp3 (S6), i.e., the current-limiting element having the third resistance Rcomp3 is connected in series with the memory 10, and the reset voltage is applied to the memory 10 (S7). Subsequently, the resistance of the memory 10 is read, and the read value is compared with the third determination value (S8). If the resistance of the memory 10 is higher than the third determination value, the process returns to step S2. If the resistance of the memory is less than the third determination value, the reset voltage is applied again. At this time, a voltage higher than the previously applied voltage may be used as the reset voltage, or the voltage is applied for a longer period of time than the previous time (S9). This applies a greater stress to the memory 10. Subsequently, the resistance of the memory 10 is read again, and the read value is compared with the third determination value (S8). This procedure is repeated until the resistance of the memory 10 becomes higher than the third determination value. The step S8 in which the resistance of the memory 10 is compared with the third determination value may be omitted. In this case, the process may proceed to step S2 immediately after the limited current value is set as the third current value Icomp3, i.e., the current-limiting element having the third resistance Rcomp3 is connected in series with the memory 10, and the reset voltage is applied. The fourth determination value is set to be lower than the first determination value.

Figure 9:
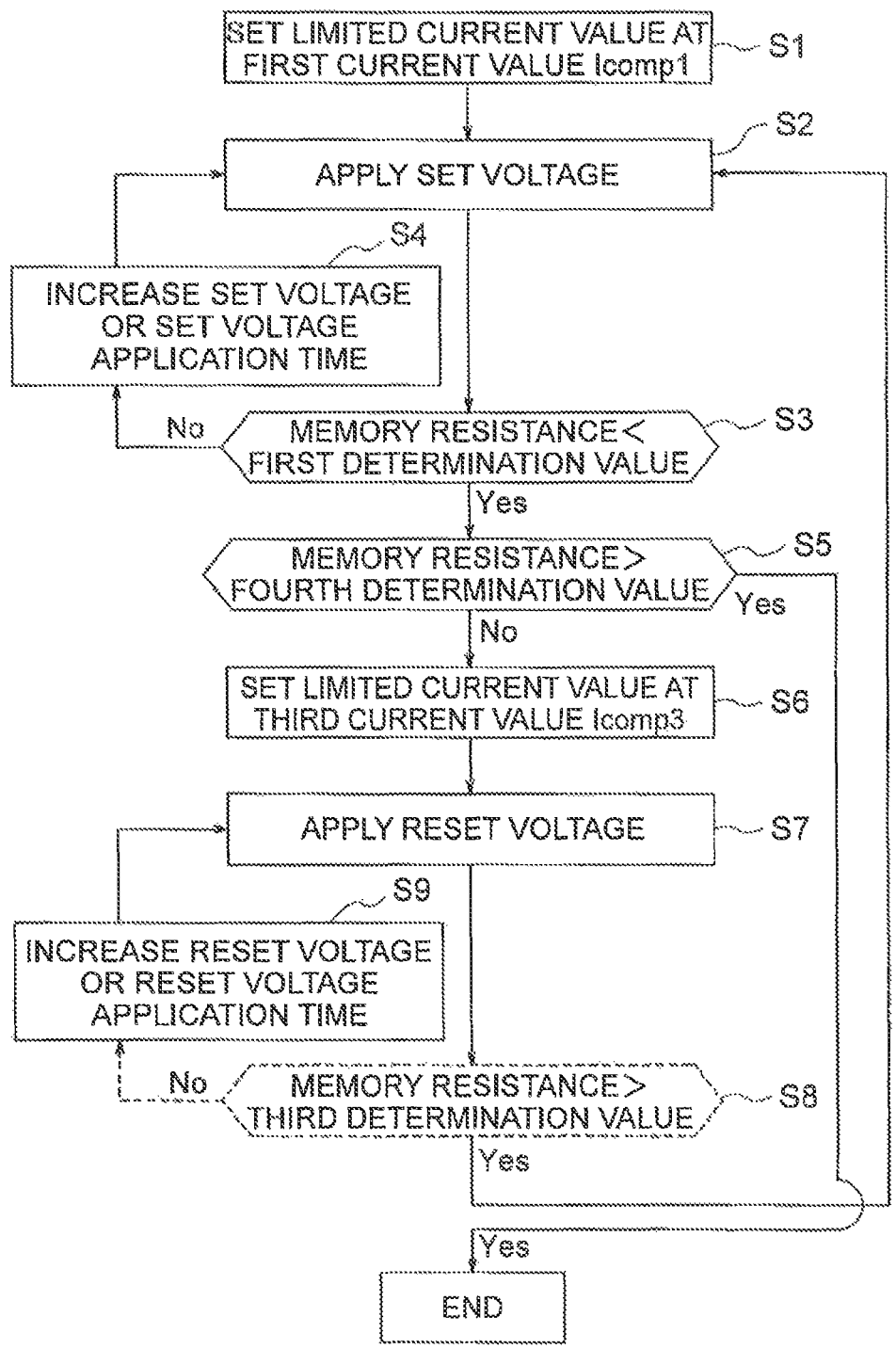
FIG. 9 is a flow chart showing another example of a specific process of set operation.

The setting process shown in FIG. 9 may prevent the ON resistance of the memory 10 from becoming too low. This may reduce the probability of unintentional resetting of the memory 10.

The limited current value in applying the reset voltage is set to be sufficiently high in the program method according to the first embodiment in order to increase the current flowing through the memory 10 to be high enough to generate heat. Programming using heat as described above is particularly effective if the memory 10 is of unipolar type. The memory 10 becomes a unipolar memory if, for example, the resistive change layer 12 of the memory 10 shown in FIG. 2 is formed of a metal oxide such as titanium oxide, hafnium oxide, and tantalum oxide, or a semiconductor oxide such as silicon oxide, the electrode 11 is formed of titanium or titanium nitride, and the electrode 13 is formed of nickel. The program method as described above is effective for this kind of memories.

First Example

Figure 10:
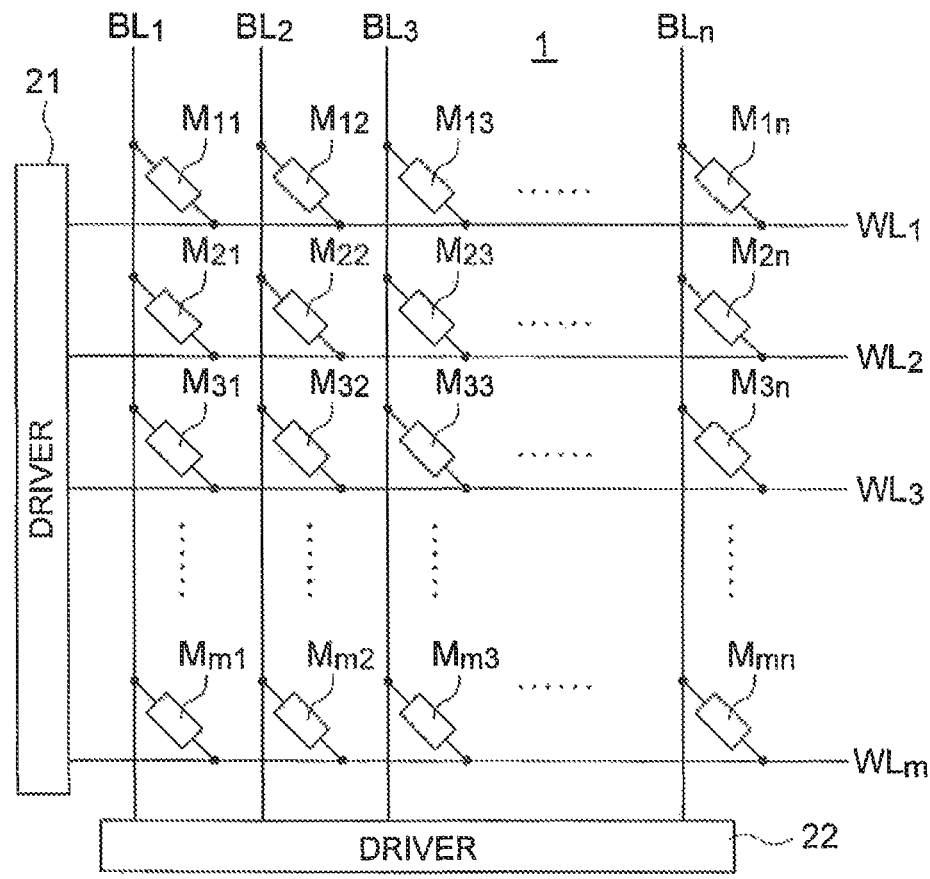
FIG. 10 is a circuit diagram showing a semiconductor integrated circuit according to a first example of the first embodiment.

FIG. 10 shows a semiconductor integrated circuit according to a first example of the first embodiment. The semiconductor integrated circuit according to the first example includes a cell array 1 with memory cells $M_{ij}$ (i=1, ..., m, j=1, ..., n) arranged in a matrix form with rows and columns, a driver 21, a driver 22, and a control circuit that is not shown. Each memory cell $M_{ij}$ (i=1, ..., m, j=1, ..., n) includes the memory 10 shown in FIG. 2. One terminal of each of n memory cells $M_{i1}$-$M_{in}$ in an i-th (i=1, ..., m) row is connected to a corresponding word line $WL_i$. The other terminal of each of m memory cells $M_{1j}$-$M_{mj}$ in a j-th (j=1, ..., n) column is connected to a corresponding bit line $BL_j$. The word lines $WL_1$-$WL_m$ are driven by the driver 21, and the bit lines $BL_1$-$BL_n$ are driven by the driver 22.

Second Example

Figure 11:
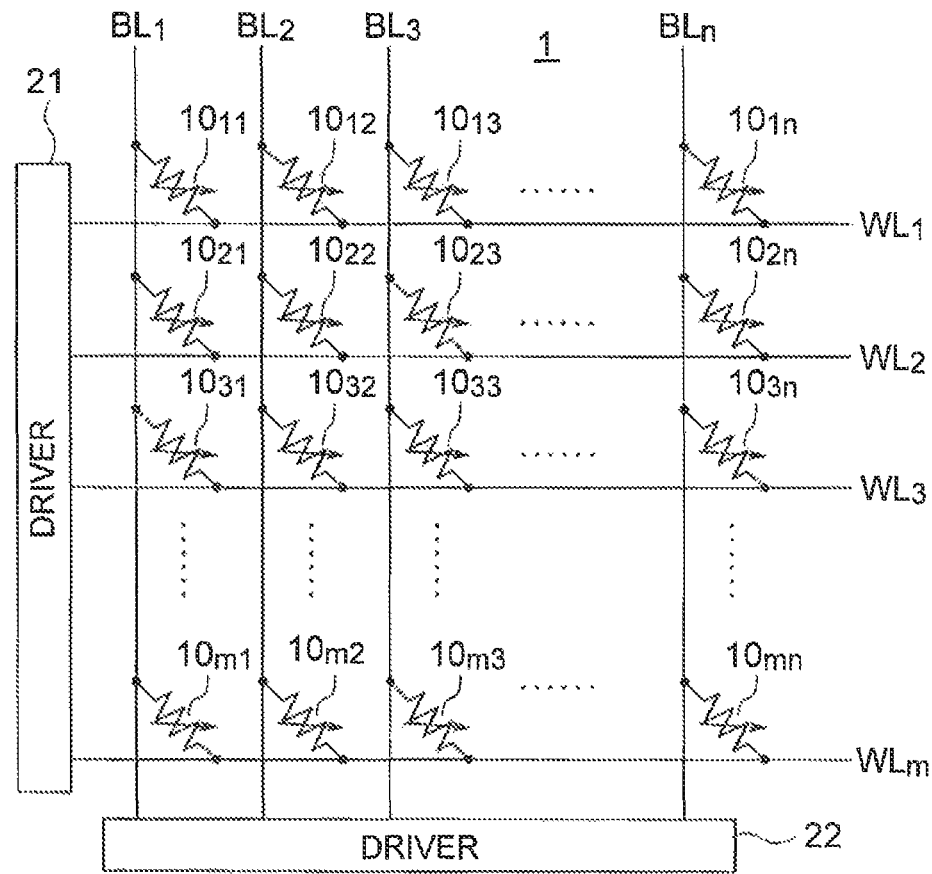
FIG. 11 is a circuit diagram showing a semiconductor integrated circuit according to a second example of the first embodiment.

FIG. 11 shows a semiconductor integrated circuit according to a second example of the first embodiment. In the semiconductor integrated circuit according to the second example, the memory cells $M_{ij}$ (i=1, ..., m, j=1, ..., n) are the memories $10_{ij}$ (i=1, ..., m, j=1, ..., n).

Third Example

Figure 12:
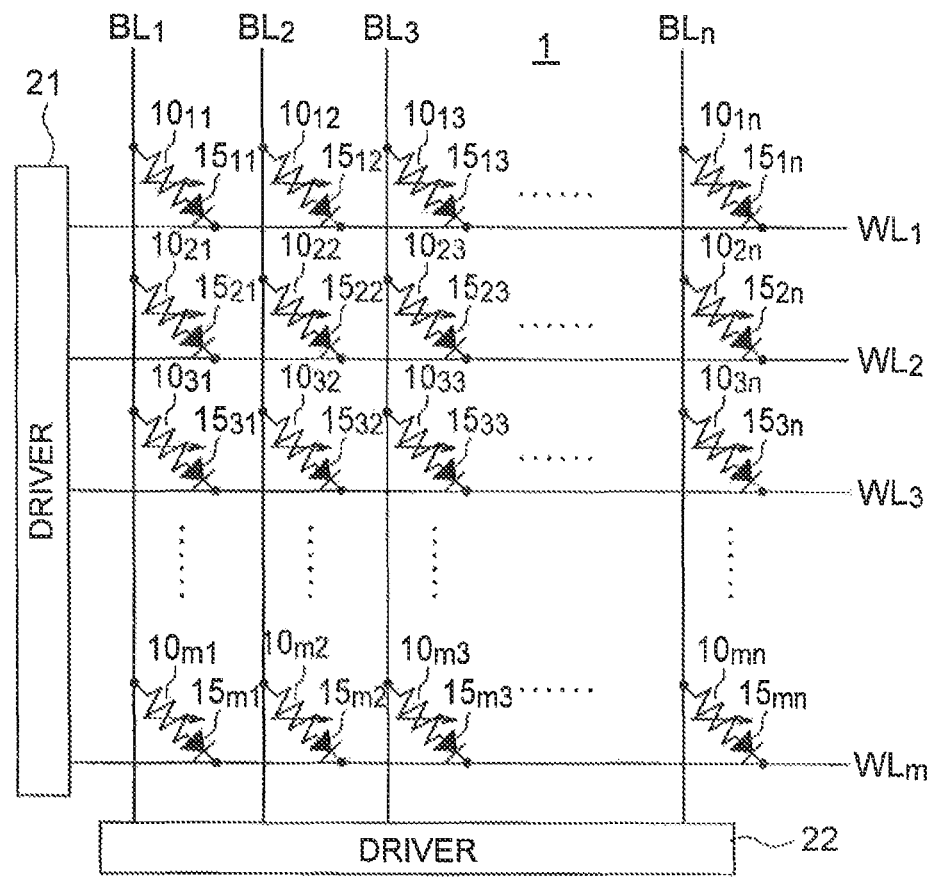
FIG. 12 is a circuit diagram showing a semiconductor integrated circuit according to a third example of the first embodiment.

FIG. 12 shows a semiconductor integrated circuit according to a third example of the first embodiment. Each memory cell $M_{ij}$ (i=1, ..., m, j=1, ..., n) of the semiconductor integrated circuit according to the third example includes a memory $10_{ij}$ and a diode $15_{ij}$ that are connected in series with each other.

One of the electrodes of the memory $10_{ij}$ in each memory cell $M_{ij}$ (i=1, ..., m, j=1, ..., n) shown in FIG. 12 is connected to a corresponding bit line $BL_j$, the other electrode is connected to the anode of the diode $15_{ij}$, and the cathode of the diode $15_{ij}$ is connected to a corresponding word line $WL_i$. On the contrary to the case shown in FIG. 12, the other electrode of the memory $10_{ij}$ may be connected to the cathode of the diode $15_{ij}$, and the anode of the diode $15_{ij}$ may be connected to the corresponding word line $WL_i$. The order of connecting the memory $10_{ij}$ and the diode $15_{ij}$ may be reversed. Specifically, the anode of the diode $15_{ij}$ in each memory cell $M_{ij}$ (i=1, ..., m, j=1, ..., n) may be connected to the corresponding bit line $BL_j$, the cathode of the diode $15_{ij}$ may be connected to one of the electrodes of the memory $10_{ij}$, and the other electrode of the memory $10_{ij}$ may be connected to the corresponding word line $WL_i$. In this case, the locations of the anode and the cathode of the diode $15_{ij}$ may be reversed.

In the first to third examples, the drivers 21, 22 set a limited current value for the programming and apply a program voltage to a selected memory in accordance with the above-described program method (for example, one of the program methods shown in FIGS. 7 to 9).

Each of the semiconductor integrated circuits according to the first to third examples can be used in, for example, a file memory for storing large capacity data. An arbitrary data item may be programmed in each memory, and the programmed data may be read as the necessity arises.

Furthermore, each of the semiconductor integrated circuits according to the first to third examples can be used as, for example, a circuit for switching wiring lines in a programmable logic device. A programmable logic device is a semiconductor integrated circuit that can be rewritten after the chip is manufactured. A programmable logic device includes a plurality of wiring lines, of which selected two wiring lines are electrically connected or disconnected.

Fourth Example

Figure 13:
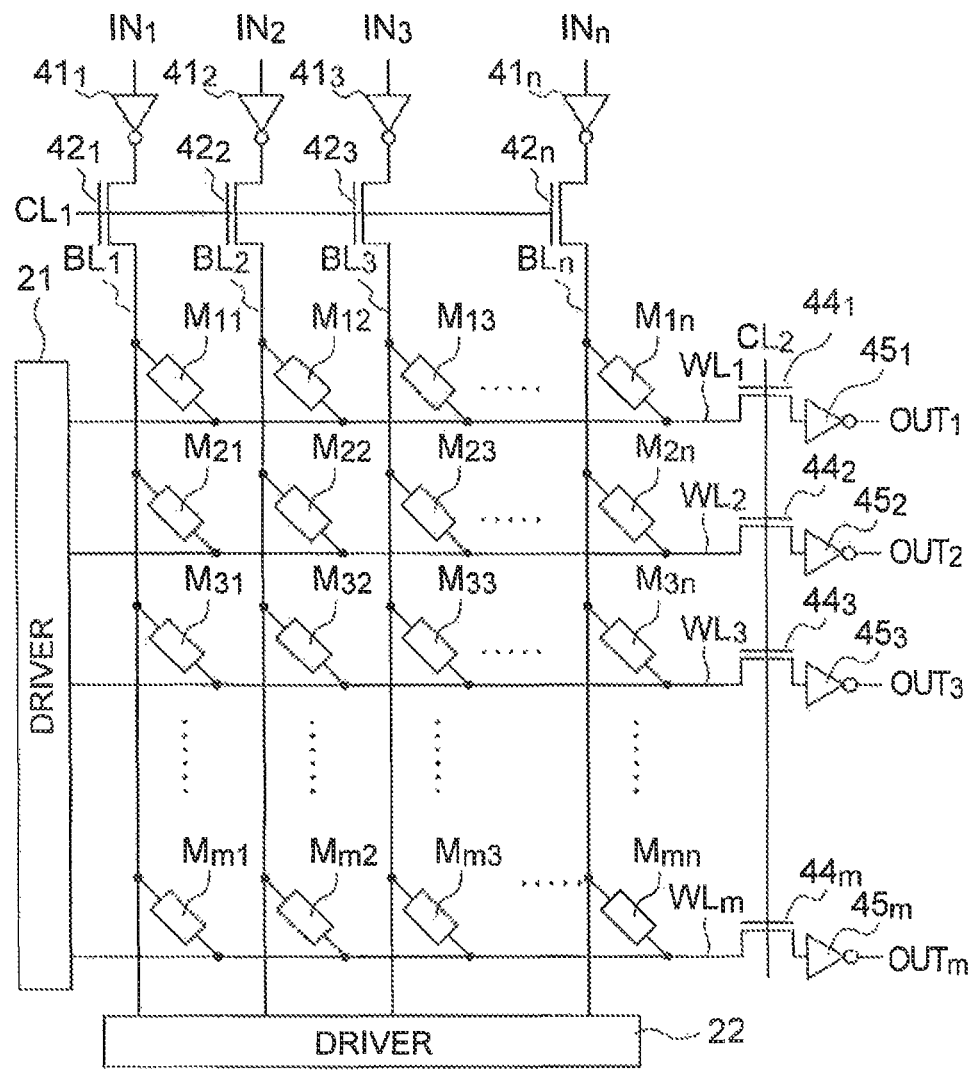
FIG. 13 is a circuit diagram showing a semiconductor integrated circuit according to a fourth example of the first embodiment.

FIG. 13 shows a semiconductor integrated circuit according to a fourth example of the first embodiment. The semiconductor integrated circuit according to the fourth example is obtained by applying the semiconductor integrated circuit according to the first example shown in FIG. 10 to a programmable logic device.

In the fourth example, each bit line $BL_j$ (j=1, ..., n) is connected to an output terminal of a buffer $41_j$ such as an inverter via a transistor $42_j$, and an input terminal of the buffer $41_j$ is connected to a corresponding input line $IN_j$. Similarly, each word line $WL_i$ (i=1, ..., m) is connected to an input terminal of a buffer $45_i$ such as an inverter via a transistor $44_i$, and an output terminal of the buffer $45_i$ is connected to a corresponding output line $OUT_i$.

Each memory cell $M_{ij}$ (i=1, ..., m, j=1, ..., n) includes a memory $10_{ij}$. A signal inputted to an input line $IN_j$ is transmitted to a corresponding output line $OUT_i$ via a memory $10_{ij}$ in a low-resistance state. The transistor $42_j$ between the bit line $BL_j$ and the buffer $41_j$, and the transistor $44_i$ between the word line $WL_i$ and the buffer $45_i$ may be omitted. It should be noted, however, that the transistors may prevent the peripheral circuits such as the buffers from being damaged by the set voltage or the reset voltage in programming the memory.

Fifth Example

Figure 14:
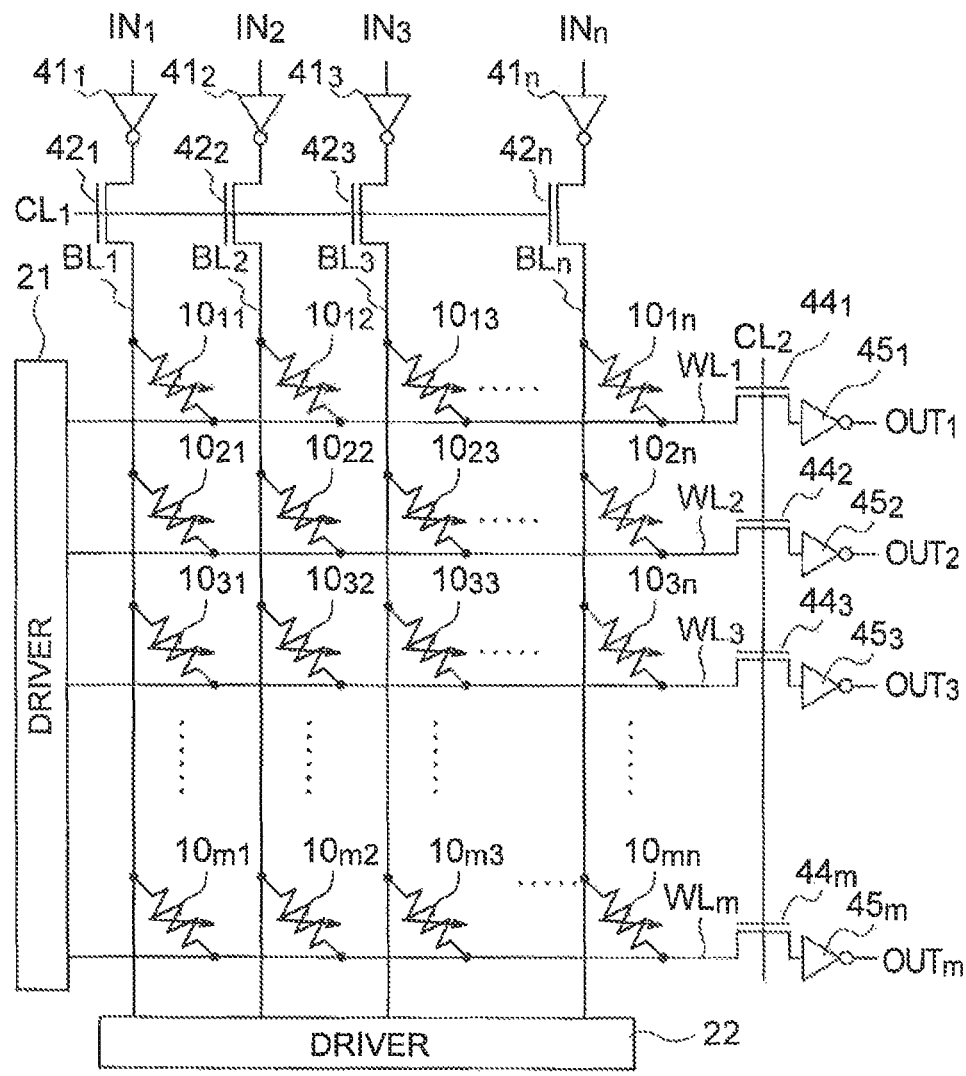
FIG. 14 is a circuit diagram of a semiconductor integrated circuit according to a fifth example of the first embodiment.

FIG. 14 shows a semiconductor integrated circuit according to a fifth example of the first embodiment. In the semiconductor integrated circuit according to the fifth example, each memory cell $M_{ij}$ (i=1, ..., m, j=1, ..., n) of the fourth example is formed only of a memory $10_{ij}$ (i=1, ..., m, j=1, ..., n). It should be noted that if the memories $10_{ij}$ (i=1, ..., m, j=1, ..., n) are applied to a programmable logic device, the use of diodes as shown in FIG. 12 is not desirable since the signal transmittance speed may vary depending on the signal levels (high/low) due to the existence of diodes.

The semiconductor integrated circuits according to the fourth example and the fifth example each include the driver 21 connected to the word lines $WL_i$ (i=1, ..., m), and the driver 22 connected to the bit lines $BL_j$ (j=1, ..., n). The drivers 21, 22 set a limited current value for the programming and apply a program voltage to a selected memory in accordance with one of the above-described program methods (for example, one of the program methods shown in FIGS. 7 to 9). It is more preferable, however, that the limited current value be set by the driver 21. The reason therefor will be described below.

It is assumed that a set voltage is applied to the memory $10_{21}$ in the semiconductor integrated circuit according to the fifth example shown in FIG. 14. At this time, a potential difference is given to the electrodes of the memory $10_{21}$ by the drivers 21, 22. It is assumed in this case that the driver 21 applies a set voltage Vset to the word line $WL_2$, and the driver 22 applies a ground voltage Vss to the bit line $BL_1$. It should be noted that the driver 21 may apply the ground voltage Vss to the word line $WL_2$, and the driver 22 may apply the set voltage Vset to the bit line $BL_1$. In both the cases, the driver 21 applies a program inhibit voltage Vinh to the word lines other than the word line $WL_2$, and the driver 22 applies the program inhibit voltage Vinh to the bit lines other than the bit line $BL_1$ so that no data is accidentally written to any of the memories other than the memory $10_{21}$. The program inhibit voltage Vinh is, for example, an intermediate voltage between Vset and Vss.

It is assumed here that the memory $10_{11}$ is already in the low-resistance state. At this time, the program inhibit voltage Vinh is applied to the word line $WL_1$ by the driver 21, and the ground voltage Vss is applied to the bit line $BL_1$ by the driver 22. If a limited current value is to be set by the driver 22, the voltage Vss is applied to the bit line $BL_1$ via a transistor for current limitation as shown in FIGS. 3A to 4B. On the other hand, the program inhibit voltage Vinh, which is applied to the word line $WL_1$ by the driver 21, is also to be applied to the bit line $BL_1$ via the memory $10_{11}$ in the low-resistance state. Whether the potential of the bit line $BL_1$ is at the ground voltage Vss or program inhibit voltage Vinh is determined by the ratio between the resistance of the transistor for current limitation and the resistance of the memory $10_{11}$. The potential of the bit line $BL_1$, however, may become close the program inhibit voltage Vinh since the transistor for current limitation has a relatively high resistance. If the potential of the bit line $BL_1$ is at the program inhibit voltage Vinh, the voltage applied to the memory $10_{21}$ becomes the program inhibit voltage Vinh. As a result, the memory $10_{21}$ cannot be set.

If the limited current value is set by the driver 21, the program inhibit voltage Vinh is applied to the word line $WL_1$ via the transistor for current limitation. On the other hand, the ground voltage Vss is applied to the bit line $BL_1$ by the driver 21 without the transistor for current limitation. This causes the potential of the bit line $BL_1$ to be at the ground voltage Vss. As a result, the memory $10_{21}$ can be reliably set.

In the above descriptions, the memory $10_{11}$ is in the low-resistance state when the memory $10_{21}$ is set.

If the memory $10_{22}$, for example, is in the low-resistance state when the memory $10_{21}$ is set, it is desirable that the limited current value is set by the driver 22, which is contrary to the above case. However, two or more memories connected to the same output line in a programmable logic device are never brought into the low-resistance state at the same time. The output line here means a wiring line connecting a memory and an input terminal of a buffer, and corresponds to a word line in FIGS. 13 and 14. A plurality of memories connected to the same word line, for example the memory $10_{21}$ and the memory $10_{22}$, being in the low-resistance state means that both the input line $IN_1$ and the input line $IN_2$ are connected to the output line $OUT_2$. This makes it unclear from which input lines a signal outputted from the output line $OUT_2$ comes.

Therefore, if the memories are applied to a programmable logic device, it is preferable that a limited current value is set by a driver (driver 21 in this case) connected to an output line (word line in this case).

As described above, according to the first embodiment and the first to fifth examples thereof, a semiconductor integrated circuit including a resistive change memory capable of easily controlling the resistance thereof after being programmed can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
a plurality of first wiring lines;
a plurality of second wiring lines crossing the first wiring lines;
a plurality of resistive change memories disposed at intersection regions of the first wiring lines and the second wiring lines, the resistive change memories each including a first electrode connected to a corresponding one of the first wiring lines, a second electrode connected to a corresponding one of the second wiring lines, and a resistive change layer disposed between the first electrode and the second electrode, a resistance between the first electrode and the second electrode being changeable among a first resistive state, a second resistive state, and a third resistive state, the second resistive state having a resistance greater than a resistance of the first resistive state, the third resistive state having a resistance lower than the resistance of the first resistive state, the resistive change memories having a first memory state in which the resistance between the first electrode and the second electrode is in the first resistive state, and a second memory state in which the resistance between the first electrode and the second electrode is in the second resistive state;
a first driver configured to drive the first wiring lines;
a second driver configured to drive the second wiring lines; and
a control circuit configured to control the first driver and the second driver,
the control circuit controlling the first driver and the second driver to select one of the first wiring lines and one of the second wiring lines for selecting one of the resistive change memories, and to program the selected one of the resistive change memories from the first memory state to the second memory state through the third resistive state,
wherein one of the first driver and the second driver includes a plurality of first transistors corresponding to ones of the first wiring lines and the second wiring lines, drains of the first transistors being connected to corresponding ones of the first wiring lines and the second wiring lines, and sources of the first transistors being connected to a first power supply.

2. The circuit according to claim 1, wherein the control circuit control the first driver and the second driver to program the selected one of the resistive change memories from the second memory state to the first memory state without going through the third resistive state.

3. The circuit according to claim 1, wherein the first driver and the second driver limit a current flowing through the selected one of the resistive change memories to be equal to or less than a first limited current value, a resistance of the selected one of the resistive change memories being changed from the first resistive state to the third resistive state, and then the first driver and the second driver limit the current flowing through the selected one of the resistive change memories to be equal to or less than a second limited current value that is higher than the first limited current value, the resistance of the selected one of the resistive change memories being changed from the third resistive state to the second resistive state.

4. The circuit according to claim 3, wherein in programming the selected one of the resistive change memories from the second memory state to the first memory state, the first driver and the second driver limit a current flowing through the selected one of the resistive change memories to be equal to or less than a third limited current value that is lower than the first limited current value.

5. The circuit according to claim 1, wherein the first driver and the second driver
apply a voltage that is higher than a voltage applied to the selected one of the second wiring lines to the selected one of the first wiring lines in programming the selected one of the resistive change memories from the first resistive state to the third resistive state, and then
apply a voltage that is higher than a voltage applied to the selected one of the second wiring lines to the selected one of the first wiring lines in programming the selected one of the resistive change memories from the third resistive state to the second resistive state.

6. The circuit according to claim 1, wherein the first driver and the second driver apply a first voltage to the selected one of the first wiring lines, a second voltage to the selected one of the second wiring lines, a third voltage that is between the first voltage and the second voltage to unselected first wiring lines, and a fourth voltage that is between the first voltage and the second voltage to unselected second wiring lines when the selected one of the resistive change memories is programmed from one of the first resistive state, the second resistive state, and the third resistive state to another.

7. The circuit according to claim 6, wherein the first driver and the second driver apply the third voltage to unselected first wiring lines and the fourth voltage to unselected second wiring lines before applying the first voltage to the selected one of the first wiring lines and the second voltage to the selected one of the second wiring lines in programming the selected one of the resistive change memories from one of the first resistive state, the second resistive state, and the third resistive state to another.

8. The circuit according to claim 1, wherein the one of the first driver and the second driver applies voltages with different values to gates of the first transistors.

9. The circuit according to claim 1, wherein the one of the first driver and the second driver further includes a plurality of second transistors corresponding to the ones of the first wiring lines and the second wiring lines, and each of the second transistors having a driving capability different from that of each of the first transistors, drains of the second transistors being connected to corresponding ones of the first wiring lines and the second wiring lines, and sources of the second transistors being connected to the a second power supply.

10. The circuit according to claim 4, wherein:
the first wiring lines are connected to a plurality of input wiring lines to which signals are inputted, and the second wiring lines are connected to a plurality of output wiring lines from which signals are outputted; and
the second driver limits the current flowing through the selected one of the resistive change memories to be equal to or less than at least one of the first limited current value, the second limited current value, and the third limited current value when the resistive change memory is programmed from one of the first resistive state, the second resistive state, and the third resistive state to another.

11. The circuit according to claim 10, further comprising a plurality of first buffers corresponding to the first wiring lines, each of the first buffers including a first input terminal connected to a corresponding one of the input wiring lines and a first output terminal connected to a corresponding one of the first wiring lines.

12. The circuit according to claim 10, further comprising a plurality of second buffers corresponding to the second wiring lines, each of the second buffers including a second input terminal connected to a corresponding one of the second wiring lines and a second output terminal connected to a corresponding one of the output wiring lines.

13. A semiconductor integrated circuit comprising:
a plurality of first wiring lines;
a plurality of second wiring lines crossing the first wiring lines;
a plurality of resistive change memories disposed at intersection regions of the first wiring lines and the second wiring lines, the resistive change memories each including a first electrode connected to a corresponding one of the first wiring lines, a second electrode connected to a corresponding one of the second wiring lines, and a resistive change layer disposed between the first electrode and the second electrode, a resistance between the first electrode and the second electrode being changeable from one of a first resistive state and a second resistive state to the other, the second resistive state having a resistance greater than a resistance of the first resistive state;
a first driver configured to drive the first wiring lines;
a second driver configured to drive the second wiring lines;
a current limitation circuit included in one of the first driver and the second driver, the current limitation circuit including a first current-limiting element with a first resistance, and a second current-limiting element with a second resistance that is less than the first resistance; and
a control circuit configured to control the first driver and the second driver,
the control circuit controlling the first driver and the second driver to select one of the first wiring lines and one of the second wiring lines for selecting one of the resistive change memories, and
when programming the selected one of the resistive change memories from the first resistive state to the second resistive state, the control circuit connecting a first terminal of the first current-limiting element to one of the selected one of the first wiring lines and the selected one of the second wiring lines and applying a voltage between a second terminal of the first current-limiting element and the other of the selected one of the first wiring lines and the selected one of the second wiring lines, and thereafter, connecting a first terminal of the second current-limiting element to the one of the selected one of first wiring lines and the selected one of the second wiring lines, and applying a voltage between a second terminal of the second current-limiting element and the other of the selected one of first wiring lines and the selected one of the second wiring lines.

14. The circuit according to claim 13, further comprising a third current-limiting element with a third resistance that is greater than the first resistance,
wherein when programming the selected one of the resistive change memories from the second resistive state to the first resistive state, the first driver and the second driver connect a first terminal of the third current-limiting element to one of the selected one of the first wiring lines and the selected one of the second wiring lines and apply a voltage between a second terminal of the third current-limiting element and the other of the selected one of the first wiring lines and the selected one of the second wiring lines.

15. The circuit according to claim 13, wherein:
the first wiring lines are connected to a plurality of input wiring lines to which signals are inputted, and the second wiring lines are connected to a plurality of output wiring lines from which signals are outputted;
the control circuit controls the first driver and the second driver to select one of the first wiring lines and one of the second wiring lines for selecting one of the resistive change memories; and
when programming the selected one of the resistive change memories from the first resistive state to the second resistive state, the control circuit connects the first terminal of the first current-limiting element to the selected one of the second wiring lines and applies a voltage between the second terminal of the first current-limiting element and the selected one of the first wiring lines, and thereafter connects the first terminal of the second current-limiting element to the selected one of the second wiring lines and applies a voltage between the second terminal of the second current-limiting element and the selected one of the first wiring lines.

16. The circuit according to claim 15, further comprising a plurality of first buffers corresponding to the first wiring lines, each of the first buffers including a first input terminal connected to a corresponding one of the input wiring lines and a first output terminal connected to a corresponding one of the first wiring lines.

17. The circuit according to claim 15, further comprising a plurality of second buffers corresponding to the second wiring lines, each of the second buffers including a second input terminal connected to a corresponding one of the second wiring lines and a second output terminal connected to a corresponding one of the output wiring lines.

18. A semiconductor integrated circuit comprising:
a plurality of first wiring lines;
a plurality of second wiring lines crossing the first wiring lines;
a plurality of resistive change memories disposed at intersection regions of the first wiring lines and the second wiring lines, the resistive change memories each including a first electrode connected to a corresponding one of the first wiring lines, a second electrode connected to a corresponding one of the second wiring lines, and a resistive change layer disposed between the first electrode and the second electrode, a resistance between the first electrode and the second electrode being changeable from one of a first resistive state and a second resistive state to the other, the second resistive state having a resistance greater than a resistance of the first resistive state;
a first driver configured to drive the first wiring lines;
a second driver configured to drive the second wiring lines;
a current limitation circuit included in one of the first driver and the second driver, the current limitation circuit including a first current-limiting element with a first resistance, a second current-limiting element with a second resistance that is less than the first resistance, and a third current-limiting element with a third resistance that is greater than the first resistance; and
a control circuit configured to control the first driver and the second driver,
the control circuit controlling the first driver and the second driver to select one of the first wiring lines and one of the second wiring lines for selecting one of the resistive change memories, and
the control circuit selects one of the first current-limiting element, the second current-limiting element, and the third current-limiting element, and connects a first terminal of the selected one of the current-limiting elements to one of the selected one of the first wiring lines and the selected one of the second wiring lines.

19. The circuit according to claim 18, wherein when programming the selected one of the resistive change memories from the first resistive state to the second resistive state, the control circuit connects a first terminal of the first current-limiting element to one of the selected one of the first wiring lines and the selected one of the second wiring lines and applies a voltage between a second terminal of the first current-limiting element and the other of the selected one of the first wiring lines and the selected one of the second wiring lines, and thereafter, connects a first terminal of the second current-limiting element to the one of the selected one of first wiring lines and the one of the second wiring lines, and applies a voltage between a second terminal of the second current-limiting element and the other of the selected one of first wiring lines and the selected one of the second wiring lines.

* * * * *